US008750016B2

United States Patent
Lee et al.

(10) Patent No.: US 8,750,016 B2
(45) Date of Patent: Jun. 10, 2014

(54) RESISTIVE MEMORY AND PROGRAM VERIFICATION METHOD THEREOF

(75) Inventors: Heng-Yuan Lee, Hsinchu County (TW); Yu-Sheng Chen, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 342 days.

(21) Appl. No.: 13/340,467

(22) Filed: Dec. 29, 2011

(65) Prior Publication Data

US 2013/0051119 A1  Feb. 28, 2013

(30) Foreign Application Priority Data

Aug. 30, 2011 (TW) .............................. 100131032 A

(51) Int. Cl.
*G11C 11/00* (2006.01)
(52) U.S. Cl.
USPC .......................... 365/148; 365/158; 365/163
(58) Field of Classification Search
USPC ............. 365/46, 94, 100, 129, 148, 158, 163; 257/2–5, 9, 310, E21.35; 438/95, 96, 438/135, 166, 240, 365, 482, 486, 597, 785
See application file for complete search history.

(56) References Cited

U.S. PATENT DOCUMENTS

| 7,006,371 | B2 | 2/2006 | Matsuoka |
| 7,289,351 | B1 | 10/2007 | Chen |
| 7,342,824 | B2 | 3/2008 | Hsu |
| 7,440,315 | B2 | 10/2008 | Lung |
| 7,480,174 | B2 | 1/2009 | Lee |
| 7,483,292 | B2 | 1/2009 | Lung |
| 7,508,695 | B2 | 3/2009 | Sugita |
| 7,544,968 | B1 | 6/2009 | Toutounchi |

(Continued)

FOREIGN PATENT DOCUMENTS

| TW | 200617989 | 6/2006 |
| TW | 200737496 | 10/2007 |

OTHER PUBLICATIONS

Lee et al., "Low Power and High Speed Bipolar Switching with a Thin Reactive Ti Buffer Layer in Robust $HfO_2$ Based RRAM," IEEE International Electron Devices Meeting, Dec. 15-17, 2008, San Francisco, CA, pp. 297-300.

(Continued)

*Primary Examiner* — Harry W Byrne
(74) *Attorney, Agent, or Firm* — Muncy, Geissler, Olds & Lowe, P.C.

(57) ABSTRACT

A resistive memory including a transistor and a variable resistor is disclosed. The transistor includes a gate, a source and a drain. The variable resistor is coupled between the drain and a node. During a setting period, the gate receives a first gate voltage, the source receives a first source voltage, the node receives a first drain voltage, and the first source voltage is equal to a grounding voltage. After the setting period, if a resistance value of the variable resistor is not less than a first pre-determined value, a first verification operation is performed. When the first verification operation is being performed, the gate receives a second gate voltage, the node receives a second drain voltage less than the first drain voltage, and the source receives a second source voltage equal to the grounding voltage.

26 Claims, 9 Drawing Sheets

(56) References Cited

U.S. PATENT DOCUMENTS

| | | | |
|---|---|---|---|
| 7,586,776 | B2 | 9/2009 | Oh |
| 2004/0105301 | A1* | 6/2004 | Toyoda et al. ............... 365/154 |
| 2004/0257864 | A1 | 12/2004 | Tamai |
| 2005/0141261 | A1 | 6/2005 | Ahn |
| 2007/0228370 | A1 | 10/2007 | Lee |
| 2008/0062740 | A1 | 3/2008 | Baek |
| 2008/0130381 | A1 | 6/2008 | VanBuskirk |
| 2008/0165572 | A1 | 7/2008 | Lung |
| 2008/0186761 | A1 | 8/2008 | Lung |
| 2008/0266933 | A1 | 10/2008 | Chen |
| 2008/0291716 | A1 | 11/2008 | Futatsuyama |
| 2009/0003066 | A1 | 1/2009 | Park |
| 2009/0027955 | A1* | 1/2009 | Koh et al. .................... 365/163 |
| 2010/0110767 | A1* | 5/2010 | Katoh et al. ................. 365/148 |
| 2010/0329055 | A1 | 12/2010 | Hsu |
| 2011/0044093 | A1* | 2/2011 | Koh et al. .................... 365/148 |

OTHER PUBLICATIONS

Sheu et al., "A 5ns Fast Write Multi-Level Non-Volatile 1 K bits RRAM Memory with Advance Write Scheme," 2009 Symposium on VLSI Circuits Digest of Technical Papers, Jun. 16-18, 2009, Kyoto, Japan, pp. 82-83.

Chen et al., "Highly Scalable Hafnium Oxide Memory with Improvements of Resistive Distribution and Read Disturb Immunity," IEE International Electron Devices Meeting, Dec. 7-9, 2009, Baltimore, MD, pp. 5.5.1-5.5.4.

Chen et al., "Non-Volatile Resistive Switching for Advanced Memory Applications," IEEE International Electron Devices Meeting, Dec. 5, 2005, pp. 746-749.

Baek et al., "Highly Scalable Non-volatile Resistive Memory using Simple Binary Oxide Drive by Asymmetric Unipolar Voltage Pulses," IEEE International Electron Devices Meeting, Dec. 13-15, 2004, pp. 587-590.

* cited by examiner

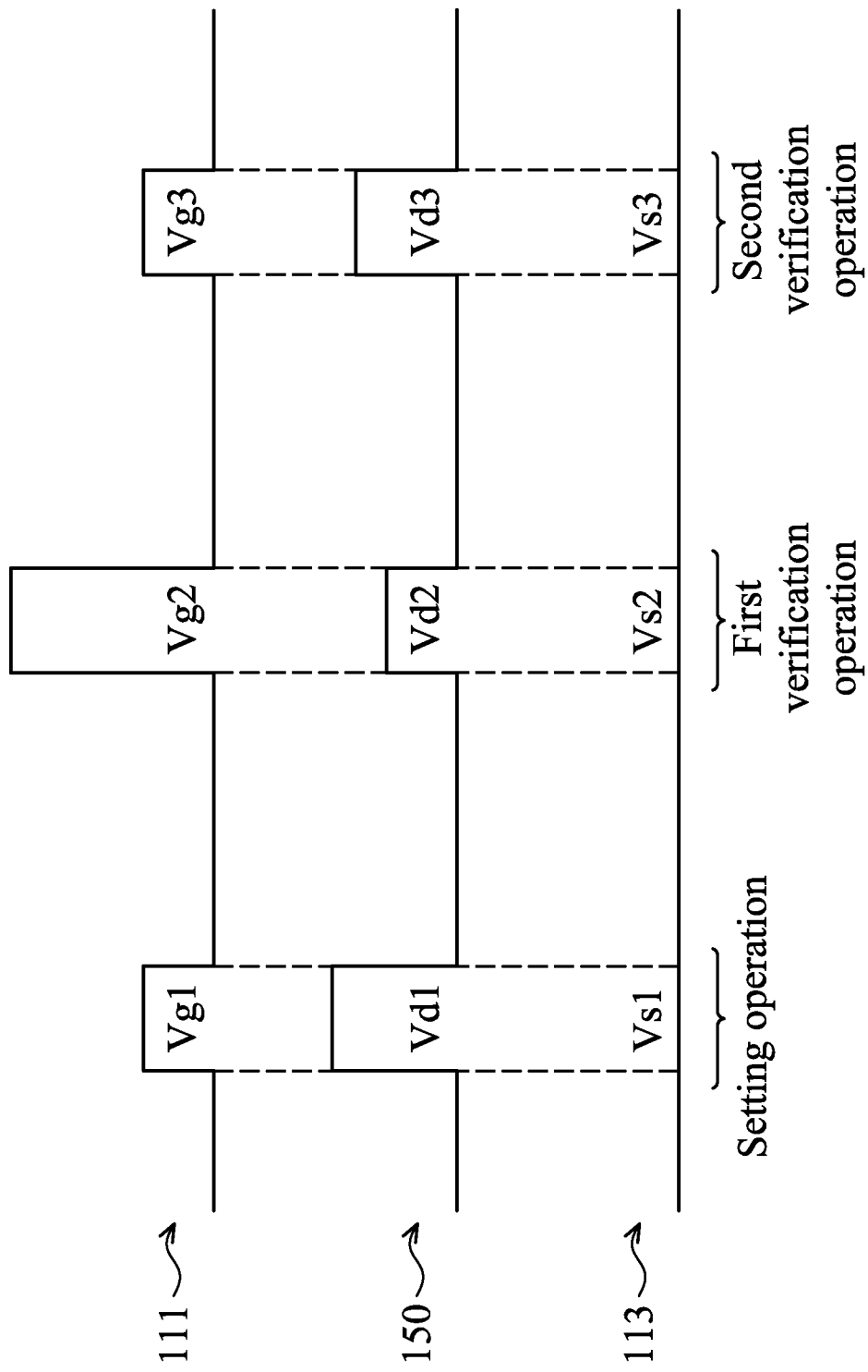

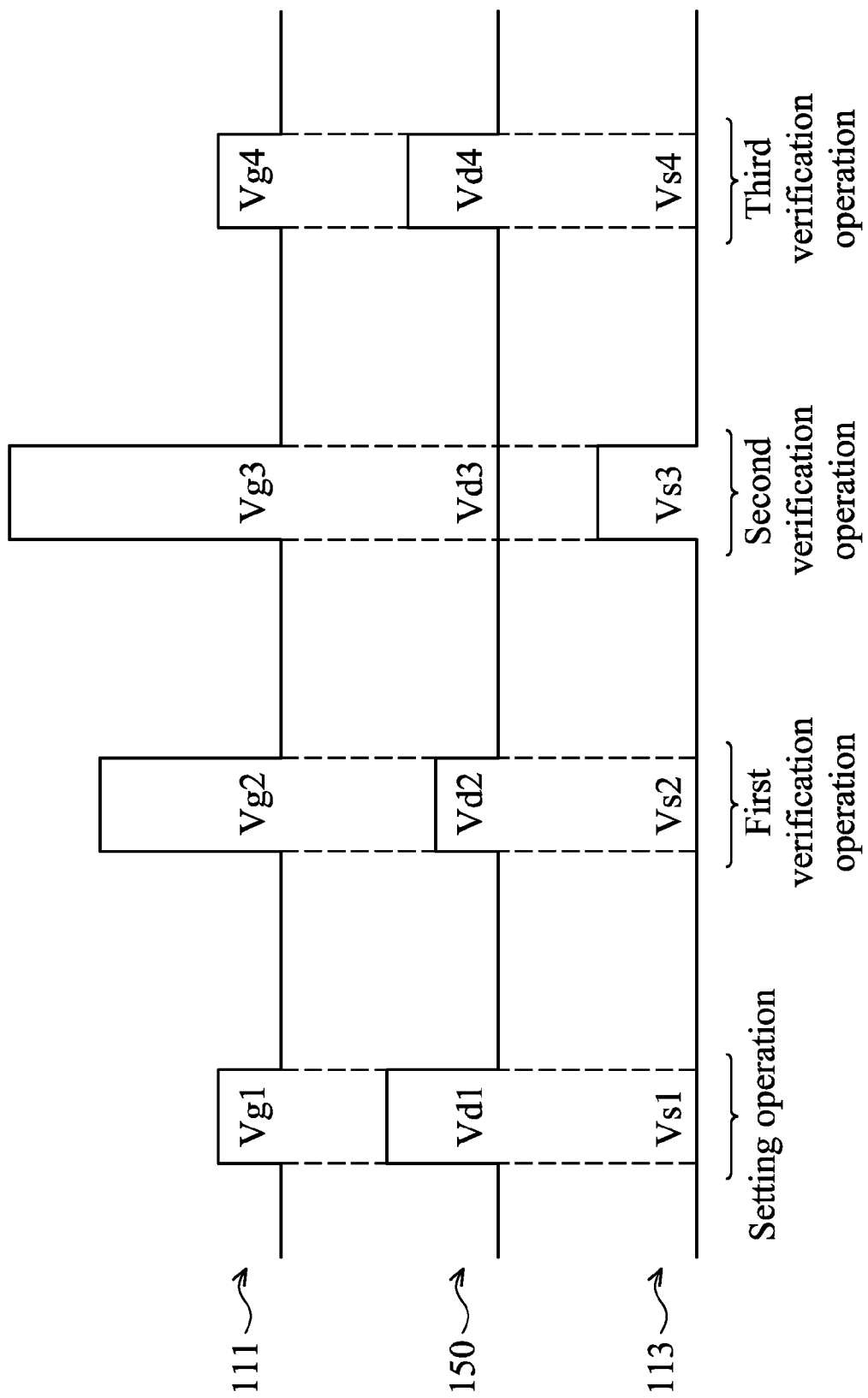

RESISTIVE MEMORY AND PROGRAM VERIFICATION METHOD THEREOF

CROSS REFERENCE TO RELATED APPLICATIONS

This Application claims priority of Taiwan Patent Application No. 100131032, filed on Aug. 30, 2011, the entirety of which is incorporated by reference herein.

BACKGROUND OF THE DISCLOSURE

1. Technical Field

The disclosure relates to a resistive memory.

2. Description of the Related Art

An advantage of a resistive random access memory (RRAM) is that resistances of memory cells of the RRAM are easily differentiated between a high value and a low value. For example, if a memory cell of the RRAM is set, the resistance value of the memory cell should be at a low value. Then, the memory cell may be reset. After resetting the memory cell, the resistance value of the memory cell should be at a high value.

However, efficiency of the RRAM becomes lower as time goes by. For example, since the property of the RRAM degrades with time, when the memory cell is set, the resistance value of the memory cell may not be at a low value. Contrarily, the resistance value of the memory cell may be at a high value after the memory cell is set. Thus, error may occur in reading or writing of the memory cell.

SUMMARY OF THE DISCLOSURE

In accordance with an embodiment, a resistive memory comprises a transistor and a variable resistor. The transistor comprises a gate, a source and a drain. The variable resistor is coupled between the drain and a node. During a setting period, the gate receives a first gate voltage, the source receives a first source voltage, the node receives a first drain voltage, and the first source voltage is equal to a grounding voltage. After the setting period, if a resistance value of the variable resistor is not less than a first pre-determined value, a first verification operation is performed. When the first verification operation is being performed, the gate receives a second gate voltage, the node receives a second drain voltage less than the first drain voltage, and the source receives a second source voltage equal to the grounding voltage.

A program verification method for a resistive memory is provided. The resistive memory comprises a transistor and a variable resistor. The transistor comprises a gate, a source, and a drain. The variable resistor is coupled between the drain and a node. An exemplary embodiment of a program verification method is described in the following. During a setting period, a first gate voltage is provided to the gate, a first source voltage is provided to the source, and a first drain voltage is provided to the node. The first source voltage is equal to a grounding voltage. After the setting period, if a resistance value of the variable resistor is not less than a first pre-determined value, a first verification operation is performed. When the first verification operation is being performed, a second gate voltage is provided to the gate, a second drain voltage is provided to the node, and a second source voltage is provided to the source. The second drain voltage is less than the first drain voltage. The second source voltage is equal to the grounding voltage.

A detailed description is given in the following embodiments with reference to the accompanying drawings.

BRIEF DESCRIPTION OF THE DRAWINGS

The disclosure can be more fully understood by referring to the following detailed description and examples with references made to the accompanying drawings, wherein:

FIGS. 2A~2D are timing diagrams of other exemplary embodiments of a program verification operation.

DETAILED DESCRIPTION OF THE DISCLOSURE

The following description is of carrying out the disclosure. This description is made for the purpose of illustrating the general principles of the disclosure and should not be taken in a limiting sense. The scope of the disclosure is determined by reference to the appended claims.

Figure 1:
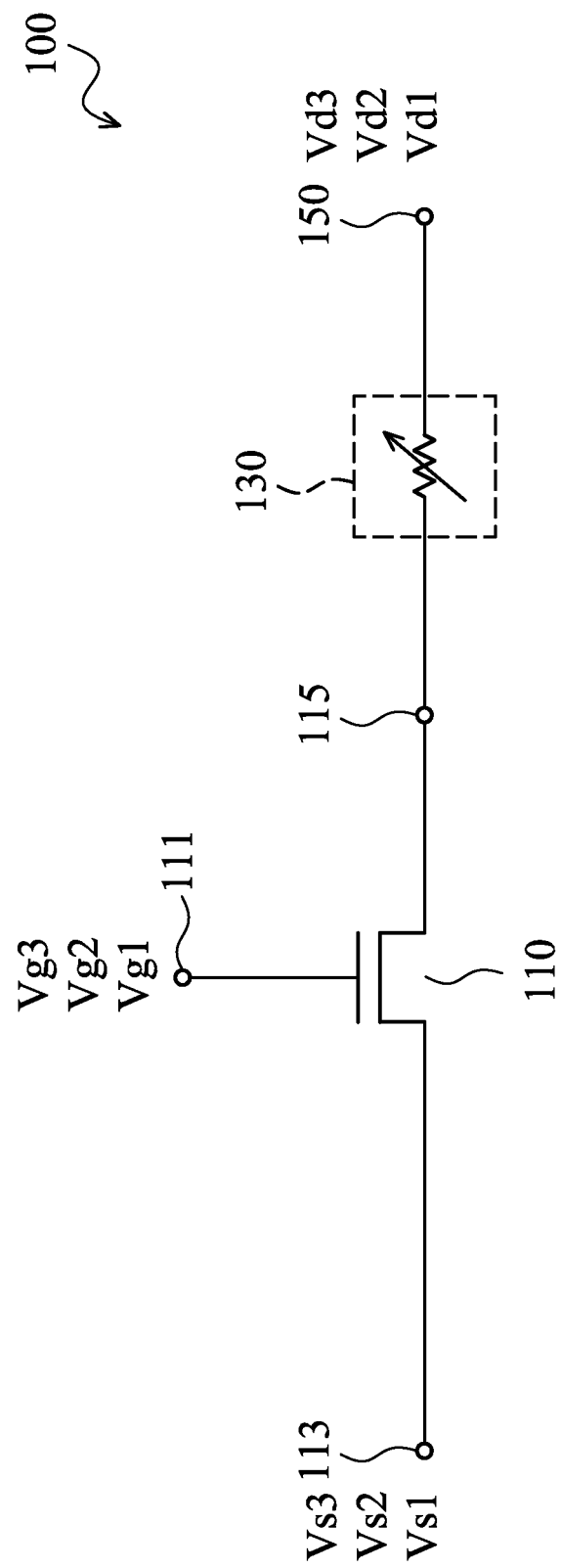
FIG. 1 is a schematic diagram of an exemplary embodiment of a resistive memory.

FIG. 1 is a schematic diagram of an exemplary embodiment of a resistive memory. The resistive memory 100 comprises a transistor 110 and a variable resistor 130. The transistor 110 comprises a gate 111, a source 113, and a drain 115. The variable resistor 130 is coupled between the drain 115 and a node 150.

During a setting period, the gate 111 receives a gate voltage Vg1. The source 113 receives a source voltage Vs1. The node 150 receives a drain voltage Vd1. In this embodiment, the source voltage Vs1 is equal to a grounding voltage shown in FIGS. 2A and 2B.

After the setting period, the resistance value of the variable resistor 130 should be at a low value. However, the resistance value of the variable resistor 130 may not be at a low level due to the property of the resistive memory 100 being degraded. Thus, after the setting period, the resistance value of the variable resistor 130 is measured to determine whether the property of the variable resistor 130 is degraded.

In this embodiment, the resistance value of the variable resistor 130 is compared with a first pre-determined value. If the resistance value of the variable resistor 130 is less than the first pre-determined value, it represents that the property of the resistance value of the variable resistor 130 has not degraded. Thus, a setting operation of the resistive memory 100 is finished. Then, a reset operation may be performed for the resistive memory 100 to change the resistance value of the variable resistor 130 from a low value to a high value. In other embodiments, after setting the resistive memory 100, the reset operation is not required to be performed. Contrarily, if the resistance value of the variable resistor 130 is not less than the first pre-determined value, it represents that the property of the variable resistor 130 has been degraded. Thus, a first verification operation is performed.

Figure 2B:
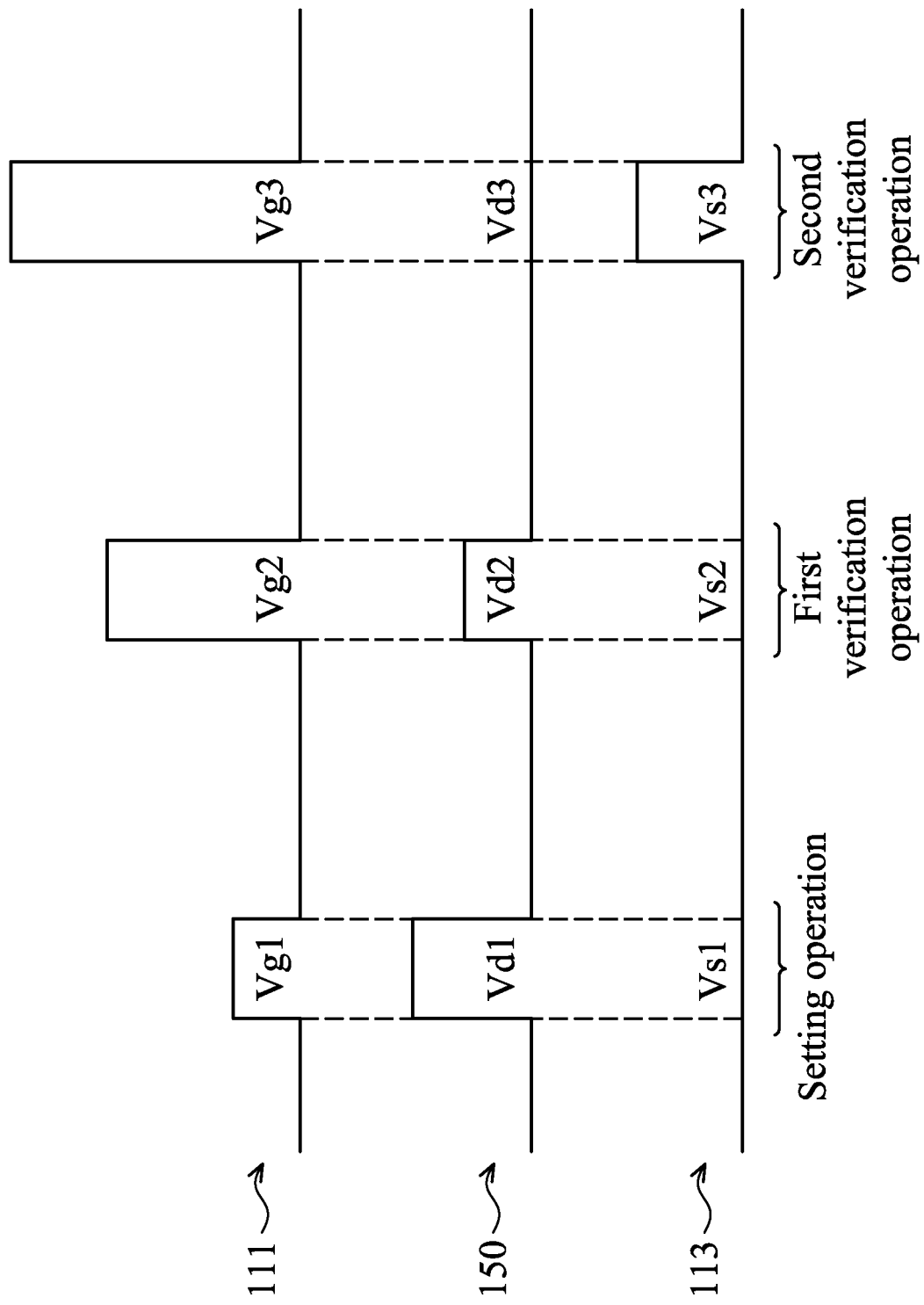

When the first verification operation is being performed, the gate 111 receives a gate voltage Vg2, the node 150 receives a drain voltage Vd2, and the source 113 receives a source voltage Vs2. In this embodiment the drain voltage Vd2 is less than the drain voltage Vd1, and the source Vs2 is equal to the grounding voltage. The disclosure does not limit the magnitude of the gate voltage Vg2. In one embodiment, the gate voltage Vg2 is higher than the gate voltage Vg1, as shown in FIGS. 2A and 2B.

After the performance of the first verification operation, the resistance value of the variable resistor 130 should be at a high value. If the resistance value of the variable resistor 130 is a high value, the drain voltage Vd2 is gradually increased until the resistance value of the variable resistor 130 is at a high value. In this embodiment, the resistance value of the variable resistor 130 is compared with a second pre-determined value. If the resistance value of the variable resistor 130 is not higher than the second pre-determined value, it represents that the resistance value of the variable resistor 130 is not at a high value. Thus, the drain voltage Vd2 is gradually increased until the resistance value of the variable resistor 130 is higher than the second pre-determined value. If the resistance value of the variable resistor 130 is higher than the second pre-determined value, a second verification operation is performed.

When the second verification operation is being performed, the gate 111 receives a gate voltage Vg3, the node 150 receives a drain voltage Vd3, and the source 113 receives a source voltage Vs3. As shown in FIG. 2A, in one embodiment, the gate voltage Vg3 is equal to the gate voltage Vg1, the drain voltage Vd3 is higher than the drain voltage Vd2, and the source voltage Vs3 is equal to the grounding voltage. The disclosure does not limit the relationship between the drain voltages Vd1 and Vd3. The drain voltage Vd3 may be higher than, less than or equal to the drain voltage Vd1.

After the performance of the second verification operation, the resistance value of the variable resistor 130 should be at a low value. Thus, in this embodiment, the resistance value of the variable resistor 130 is again compared with the first pre-determined value. If the resistance value of the variable resistor 130 is not less than the first pre-determined value, it represents that the resistance value of the variable resistor 130 is not at a low value. Thus, the drain voltage Vd3 is gradually increased until the resistance value of the variable resistor 130 is less than the first pre-determined value.

In other embodiments (as shown in FIG. 2B), when the second verification operation is being performed, the gate voltage Vg3 is higher than the gate voltage Vg1, the drain voltage Vd3 is equal to the grounding voltage, and the source voltage Vs3 is higher than the source voltage Vs2. At this time, the resistance value of the variable resistor 130 should be less than a third pre-determined value. After the performance of the second verification operation, if the resistance value of the variable resistor 130 is not less than the third pre-determined value, the source voltage Vs3 is gradually increased until the resistance value of the variable resistor 130 is less than the third pre-determined value. The third pre-determined value is equal to or higher than the first pre-determined value. If the third pre-determined value is equal to the first pre-determined value, a setting operation for the resistive memory 100 is finished after the performance of the second verification operation.

Contrarily, if the third pre-determined value is higher than the first pre-determined value, a third verification operation is performed. Referring to FIG. 2C, when the third verification operation is being performed, the gate 111 receives a gate voltage Vg4, the node 150 receives a drain voltage Vd4, and the source 113 receives a source voltage Vs4. In FIG. 2C, the gate voltage Vg4 is equal to the gate voltage Vg1, the drain voltage Vd4 is higher than the drain voltage Vd2, and the source voltage Vs4 is equal to the grounding voltage.

Figure 2D:
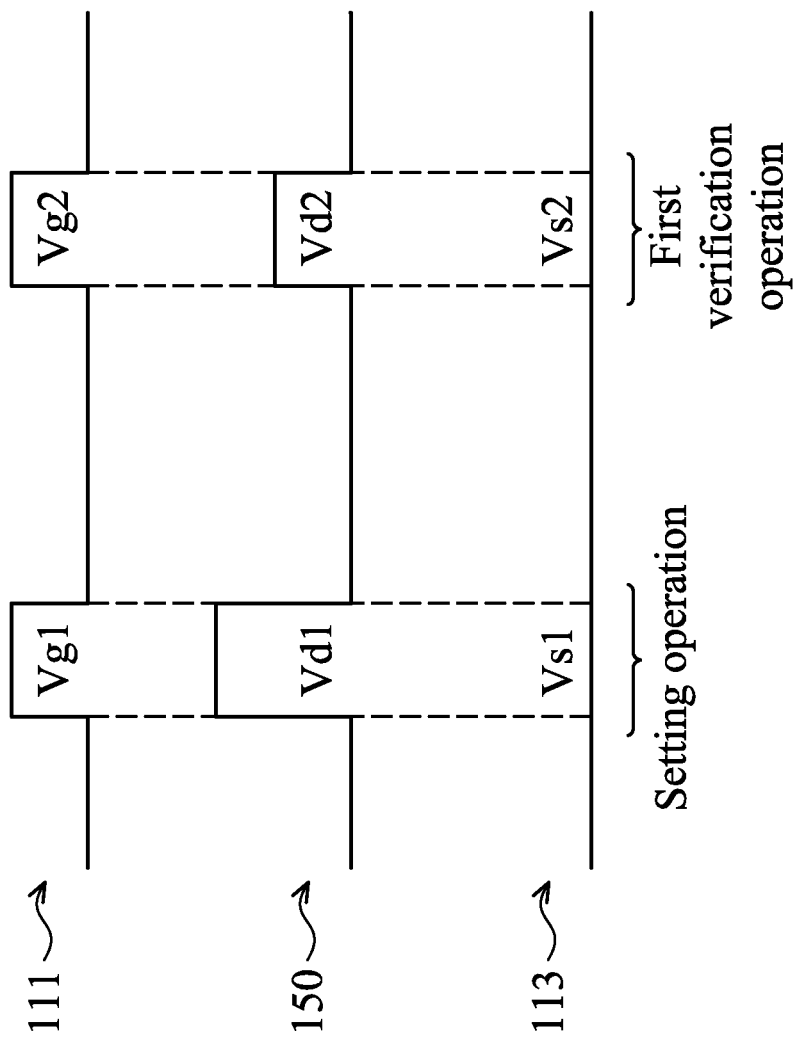

In FIGS. 2A and 2B, the gate voltage Vg2 is higher than the gate voltage Vg1. In another embodiment, the gate voltage Vg2 is equal to the gate voltage Vg1. Referring to FIG. 2D, during a setting period, the gate 111 receives the gate voltage Vg1, the node 150 receives the drain voltage Vd1 and the source 113 receives the source voltage Vs1. After the setting period, the resistance value of the variable resistor 130 should be at a low value.

If the resistance value of the variable resistor 130 is less than a first pre-determined value, it represents that the resistance value of the variable resistor 130 is at a low value. Thus, a setting operation for the resistive memory 100 is finished and then a reset operation can be performed for the resistive memory 100 to make the resistance value of the variable resistor 130 to be at a high value. Similarly, the reset operation is not required to be performed. For example, if the resistance value of the variable resistor 130 is at a low level, the reset operation can be omitted.

If the resistance value of the variable resistor 130 is not less than the first pre-determined value, it represents that the resistance value of the variable resistor 130 is not at a low level. Thus, a first verification operation is performed. When the first verification operation is being performed, the gate 111 receives the gate voltage Vg2, the node 150 receives the drain voltage Vd2, and the source 113 receives the source voltage Vs2. In this embodiment, the gate voltage Vg2 is equal to the gate voltage Vg1, the drain voltage Vd2 is less than the drain voltage Vd1, and the source voltage Vs2 is equal to the source voltage Vs1.

After the performance of the first verification operation, the resistance value of the variable resistor 130 should be at a low value. Thus, the resistance value of the variable resistor 130 is compared with a second pre-determined value. If the resistance value of the variable resistor 130 is not less than the second pre-determined value, the drain voltage Vd2 is gradually increased until the resistance value of the variable resistor 130 is less than the second pre-determined value. In one embodiment, the second pre-determined value is equal to the first pre-determined value.

FIGS. 3A~3D are schematic diagrams of exemplary embodiments of a program verification method. The program verification method is applied to a resistive memory as shown in FIG. 1. The operation of the program verification method is described in greater detail with reference to FIG. 1.

Figure 3A:
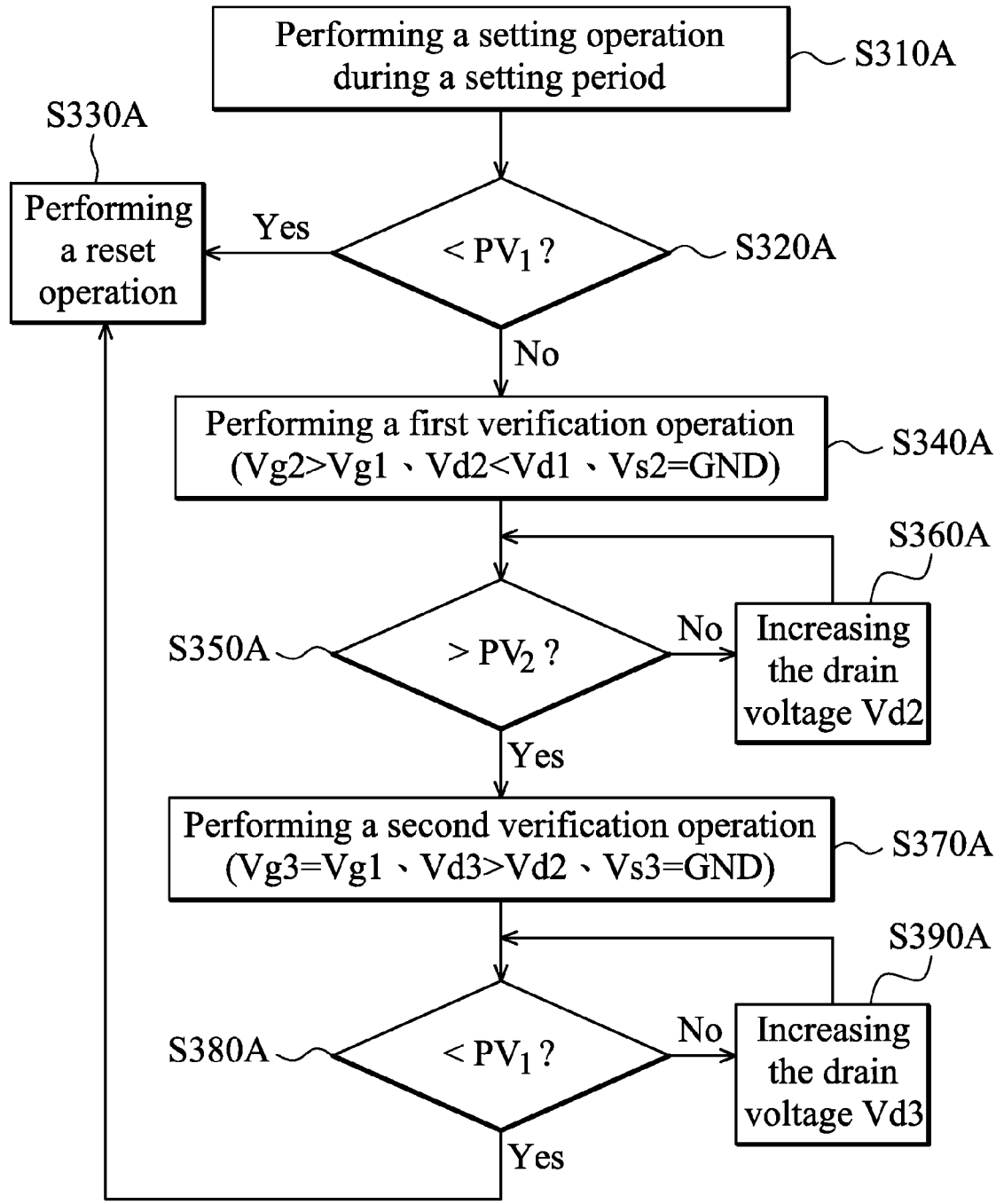
FIGS. 3A~3D are schematic diagrams of other exemplary embodiments of a program verification method.

Referring to FIG. 3A, during a setting period, a setting operation is performed (step S310A). In this embodiment, the setting operation is to provide a gate voltage Vg1 to the gate 111, provide a drain voltage Vd1 to the node 150 and provide a source voltage Vs1 to the source 113. In one embodiment, the source voltage Vs1 is equal to a grounding voltage GND.

It is determined whether the resistance value of the variable resistor 130 is less than a pre-determined value $PV_1$ (step S320A). If the resistance value of the variable resistor 130 is less than the pre-determined value $PV_1$, a reset operation is performed (step S330A) to set the resistance value of the variable resistor 130 to a high value. In other embodiments, the reset operation can be omitted if the resistance value of the variable resistor 130 is not required to be set to a high value.

If the resistance value of the variable resistor 130 is not less than the pre-determined value $PV_1$, a first verification operation is performed (step S340A). When the first verification operation is being performed, a gate voltage Vg2 is provided to the gate 111, a drain voltage Vd2 is provided to the node 150, and a source voltage Vs2 is provided to the source 113. In this embodiment, the gate voltage Vg2 is higher than the gate voltage Vg1, the drain voltage Vd2 is less than the drain voltage Vd1, and the source voltage Vs2 is equal to the grounding voltage GND.

After the performance of the first verification operation, it is determined whether the resistance value of the variable resistor 130 is higher than a pre-determined value $PV_2$ (step S350A). If the resistance value of the variable resistor 130 is not higher than the pre-determined value $PV_2$, the drain voltage Vd2 is increased (step S360A) and then step S350A is executed to determine again whether the resistance value of the variable resistor 130 is higher than the pre-determined value $PV_2$. If the resistance value of the variable resistor 130 is not higher than the pre-determined value $PV_2$, the drain voltage Vd2 is again increased until the resistance value of the variable resistor 130 is higher than the pre-determined value $PV_2$. In this embodiment, the drain voltage Vd2 is gradually increased such that the resistance value of the variable resistor 130 is higher than the pre-determined value $PV_2$.

When the resistance value of the variable resistor 130 is higher than the pre-determined value $PV_2$, a second verification operation is performed (step S370A). When the second verification operation is being performed, a gate voltage Vg3 is provided to the gate 111, a drain voltage Vd3 is provided to the node 150, and the source voltage Vs3 is provided to the source 113. In this embodiment, the gate voltage Vg3 is equal to the gate voltage Vg1, the drain voltage Vd3 is higher than the drain voltage Vd2, and the source voltage is equal to the grounding voltage GND.

After the performance of the second verification operation, it is determined whether the resistance value of the variable resistor 130 is less than the pre-determined value $PV_1$ (step S380A). If the resistance value of the variable resistor 130 is less than the pre-determine value $PV_1$, a reset operation is performed (step S330A) such that the resistance value of the variable resistor 130 is at a high value. In other embodiments, the reset operation can be omitted if the resistance value of the variable resistor 130 is not required to be set to a high value.

If the resistance value of the variable resistor 130 is not less than the pre-determined value $PV_1$, the drain voltage Vd3 is increased (step S390A) and then step S380A is executed to determine whether the resistance value of the variable resistor 130 is not less than the pre-determined value $PV_1$. If the resistance value of the variable resistor 130 is not less than the pre-determined value $PV_1$, the drain voltage Vd3 is increased until the resistance value of the variable resistor 130 is less than the pre-determined value $PV_1$. In this embodiment, the drain voltage Vd3 is gradually increased.

Figure 3B:
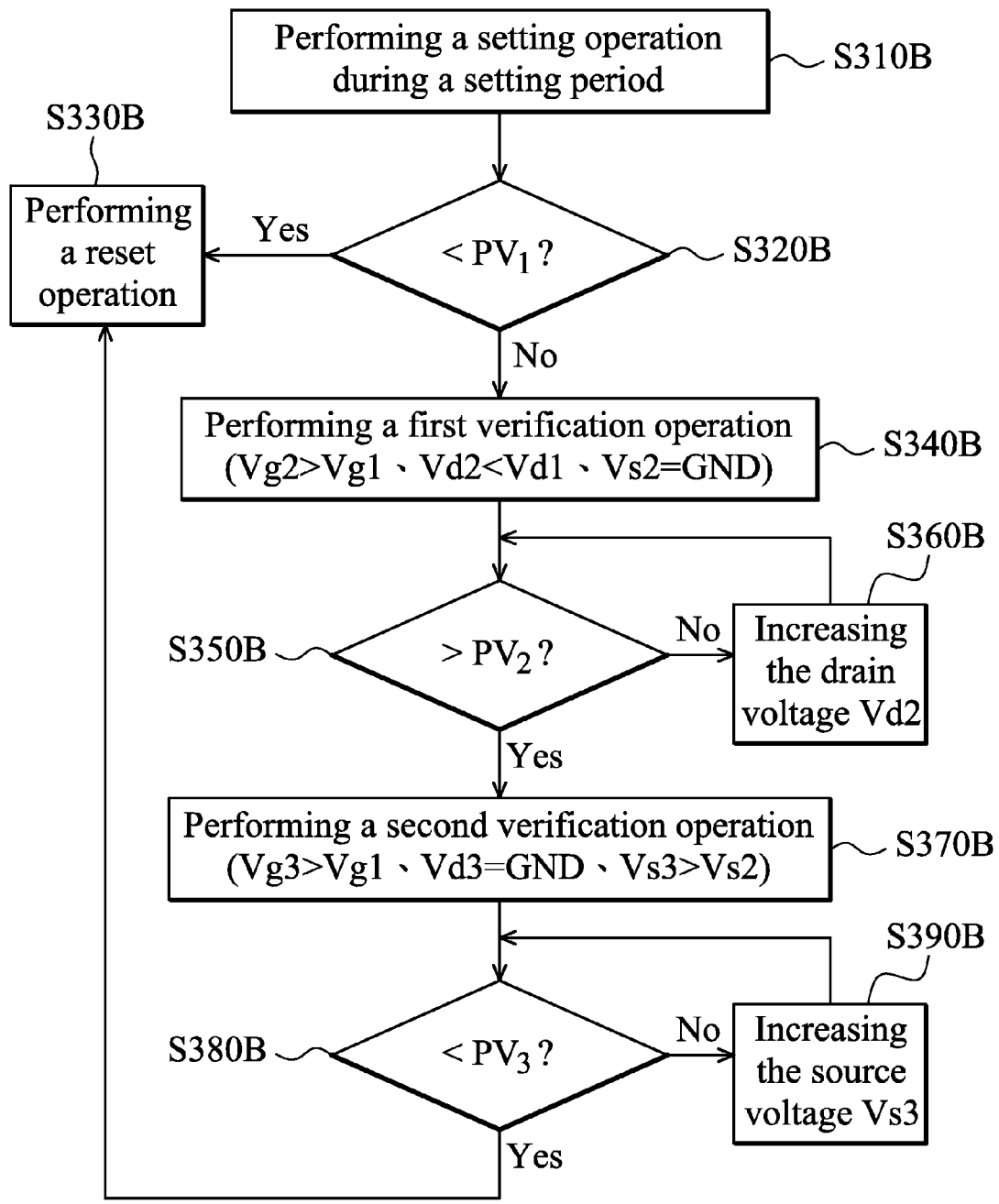

FIG. 3B is a schematic diagram of another exemplary embodiment of the resistive memory. FIG. 3B is similar to FIG. 3A except for steps S370B, S380B and S390B. Since steps S310A~S360A and S310B~S360B have the same principle, descriptions of step S310B~S360B are omitted for brevity.

In step S370B, a second verification operation is performed. A gate voltage Vg3 is provided to the gate 111. A drain voltage Vd3 is provided to the node 150. A source voltage Vs3 is provided to the source 113. In this embodiment, the gate voltage Vg3 is higher than the gate voltage Vg1, the drain voltage Vd3 is equal to the grounding voltage GND, and the source voltage Vs3 is higher than the source voltage Vs2.

Next, it is determined whether the resistance value of the variable resistor 130 is less than a pre-determined value $PV_3$ (step S380B). If the resistance value of the variable resistor 130 is not less than the pre-determined value $PV_3$, the source voltage Vs3 is increased (step S390B) and then step S380B is executed to again determine whether the resistance value of the variable resistor 130 is less than the pre-determined value $PV_3$ until the resistance value of the variable resistor 130 is less than the pre-determined value $PV_3$. In this embodiment, the source voltage Vs3 is gradually increased to make the resistance value of the variable resistor 130 to be less than the pre-determined value $PV_3$. In one embodiment, the pre-determined value $PV_3$ is equal to or higher than the pre-determined value $PV_1$.

Assuming the pre-determined value $PV_3$ is equal to the pre-determined value $PV_1$. When the resistance value of the variable resistor 130 is less than the pre-determined value $PV_3$, it represents that a setting operation is finished for the resistive memory 100. In one embodiment, after setting the resistive memory 100, a reset operation is performed for the resistive memory 100 (step S330B). In other embodiments, if the reset operation is not required for the resistive memory 100, step 330B is omitted.

Figure 3C:
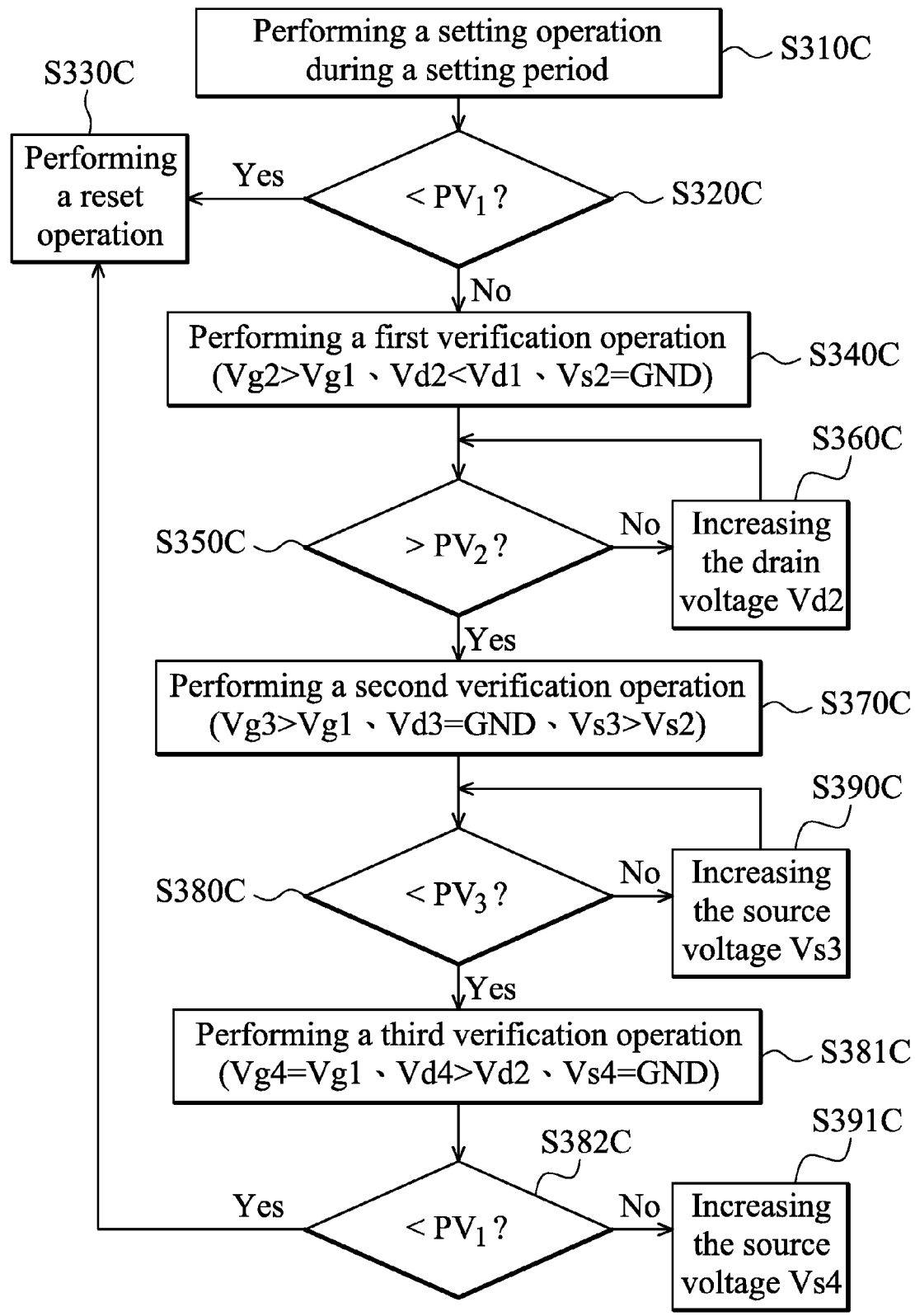

In addition, assuming the pre-determined value $PV_3$ is higher than the pre-determined value $PV_1$. Referring to FIG. 3C, a third verification operation is performed (step S381C). When the third verification operation is being performed, a gate voltage Vg4 is provided to the gate 111, a drain voltage Vd4 is provided to the node 150 and a source voltage Vs4 is provided to the source 113. The gate voltage Vg4 is equal to the gate voltage Vg1. The drain voltage Vd4 is higher than the drain voltage Vd2. The source voltage Vs4 is equal to the grounding voltage.

As shown in FIG. 3C, after step S381C, it is determined whether the resistance value of the variable resistor 130 is less than the pre-determined value $PV_1$ (step S382C). If the resistance value of the variable resistor 130 is not less than the pre-determined value $PV_1$, the source voltage Vs4 is increased (step S391C) until the resistance value of the variable resistor 130 is less than the pre-determined value $PV_1$. If the resistance value of the variable resistor 130 is less than the pre-determined value $PV_1$, it represents that a setting operation for the resistive memory 100 is finished. Thus, a reset operation can be executed for the resistive memory 100. However, the reset operation can be omitted if the resistive memory 100 is not required to be reset.

Figure 3D:
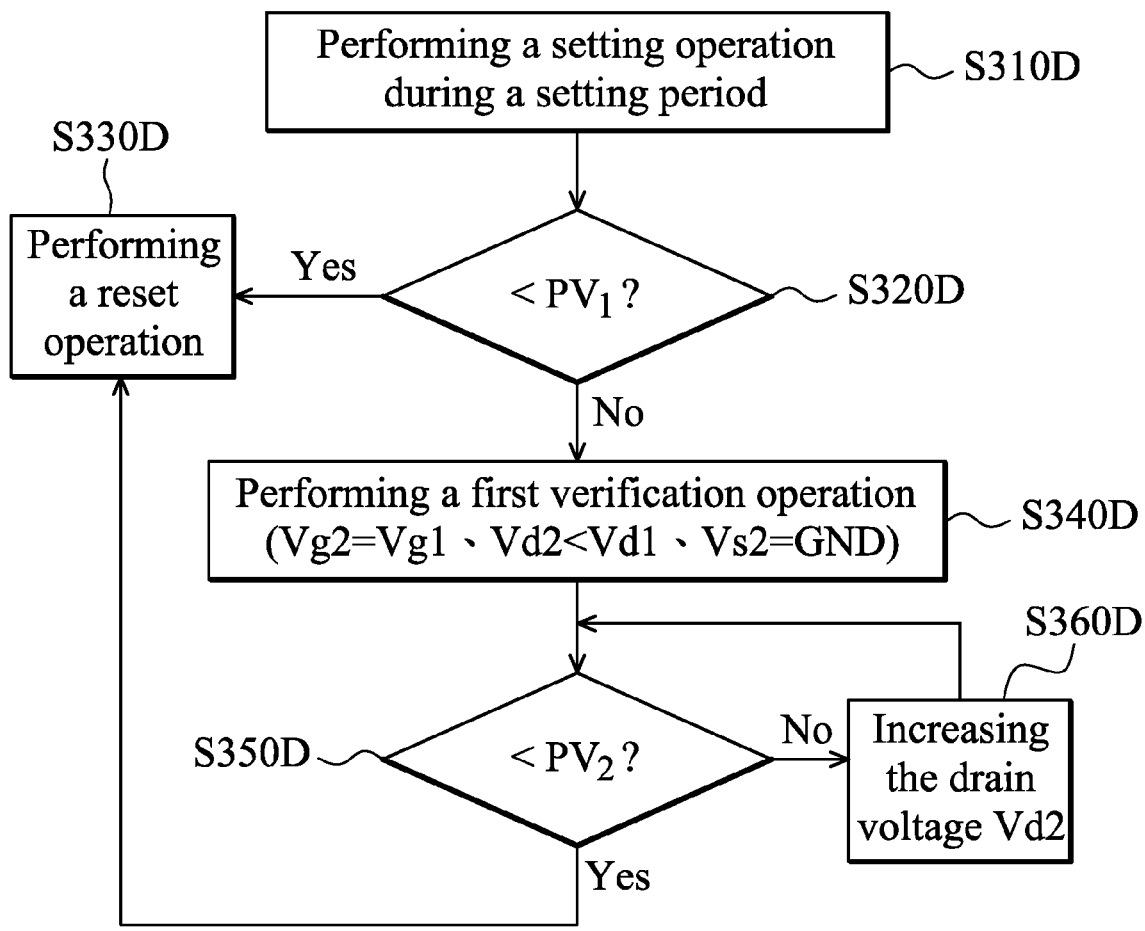

FIG. 3D is a schematic diagram of another exemplary embodiment of the resistive memory. FIG. 3D is similar to FIG. 3A except for steps S340D~S360C. Since steps S310A~S330A and S310D~S330D have the same principle, descriptions of step S310D~S330D are omitted for brevity.

In step S340D, a first verification operation is performed. A gate voltage Vg2 is provided to the gate 111. A drain voltage Vd2 is provided to the node 150. A source voltage Vs2 is provided to the source 113. In this embodiment, the gate voltage Vg2 is equal to the gate voltage Vg1, the drain voltage Vd2 is less than the drain voltage Vd1 and the source voltage Vs2 is equal to the grounding voltage GND.

Then, it is determined whether the resistance value of the variable resistor 130 is less than the pre-determined value $PV_2$ (step S350D). If the resistance value of the variable resistor 130 is less than the pre-determined value $PV_2$, a reset operation is performed (step S330D) to reset the resistance value of the variable resistor 130 from a low value to a high value. In some embodiments, step S330D can be omitted.

If the resistance value of the variable resistor 130 is not less than the pre-determined value $PV_2$, the drain voltage Vd2 is increased (step S360D) and then step S350D is performed to again and again determine whether the resistance value of the variable resistor 130 is less than the pre-determined value $PV_2$ until the resistance value of the variable resistor 130 is less than the pre-determined value $PV_2$. In one embodiment, the pre-determined value $PV_2$ is equal to the pre-determined value $PV_1$.

When the first and the second verification operations are performed, the resistance value of the resistive memory can be set to a low value to compensate for the aging issue. In addition, the gate voltage Vg, the drain voltage Vd and the source voltage Vs are controlled such that the resistance value of the resistive memory is set to a low value and only one verification operation is performed.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A resistive memory, comprising:
a transistor comprising a gate, a source and a drain; and
a variable resistor coupled between the drain and a node,
wherein during a setting period, the gate receives a first gate voltage, the source receives a first source voltage, the node receives a first drain voltage, and the first source voltage is equal to a grounding voltage,
wherein after the setting period, if a resistance value of the variable resistor is not less than a first pre-determined value, a first verification operation is being performed,
wherein when the first verification operation is being performed, the gate receives a second gate voltage, the node receives a second drain voltage less than the first drain voltage, and the source receives a second source voltage equal to the grounding voltage.

2. The resistive memory as claimed in claim 1, wherein the second gate voltage is higher than the first gate voltage.

3. The resistive memory as claimed in claim 2, wherein after the performance of the first verification operation, if the resistance value of the variable resistor is not higher than a second pre-determined value, the second drain voltage is gradually increased until the resistance value of the variable resistor is higher than the second pre-determined value.

4. The resistive memory as claimed in claim 3, wherein after the performance of the first verification operation, if the resistance value of the variable resistor is higher than the second pre-determined value, a second verification operation is being performed, and
wherein when the second verification operation is being performed, the gate receives a third gate voltage, the node receives a third drain voltage, and the source receives a third source voltage, and
wherein the third gate voltage is equal to the first gate voltage, the third drain voltage is higher than the second drain voltage, and the third source voltage is equal to the grounding voltage.

5. The resistive memory as claimed in claim 4, wherein after the performance of the second verification operation, if the resistance value of the variable resistor is not less than the first pre-determined value, the third drain voltage is gradually increased until the resistance value of the variable resistor is less than the first pre-determined value.

6. The resistive memory as claimed in claim 3, wherein after the performance of the first verification operation, if the resistance value of the variable resistor is higher than the second pre-determined value, a second verification operation is performed, and
wherein when the second verification operation is being performed, the gate receives a third gate voltage, the node receives a third drain voltage, and the source receives a third source voltage, and
wherein the third gate voltage is higher than the first gate voltage, the third drain voltage is equal to the grounding voltage, and the third source voltage is higher than the second source voltage.

7. The resistive memory as claimed in claim 6, wherein after the performance of the second verification operation, if the resistance value of the variable resistor is not less than the first pre-determined value, the third source voltage is gradually increased until the resistance value of the variable resistor is less than the first pre-determined value.

8. The resistive memory as claimed in claim 6, wherein after the performance of the second verification operation, if the resistance value of the variable resistor is not less than a third pre-determined value, the third source voltage is gradually increased until the resistance value of the variable resistor is less than the third pre-determined value, and
wherein the third pre-determined value is higher than the first pre-determined value.

9. The resistive memory as claimed in claim 8, wherein if the resistance value of the variable resistor is less than the third pre-determined value, and a third verification operation is performed,
wherein when the third verification operation is being performed, the gate receives a fourth gate voltage, the node receives a fourth drain voltage, and the source receives a fourth source voltage, and
wherein the fourth gate voltage is equal to the first gate voltage, the fourth drain voltage is higher than the second drain voltage, and the fourth source voltage is higher than the grounding voltage.

10. The resistive memory as claimed in claim 9, wherein after the performance of the third verification operation, if the resistance value of the variable resistor is not less than the first pre-determined value, the fourth source voltage is gradually increased until the resistance value of the variable resistor is less than the first pre-determined value.

11. The resistive memory as claimed in claim 1, wherein the second gate voltage is equal to the first gate voltage.

12. The resistive memory as claimed in claim 11, wherein after the performance of the first verification operation, if the resistance value of the variable resistor is not less than a second pre-determined value, the second drain voltage is gradually increased until the resistance value of the variable resistor is less than the second pre-determined value.

13. The resistive memory as claimed in claim 12, wherein the second pre-determined value is equal to the first pre-determined value.

14. A program verification method for a resistive memory comprising a transistor and a variable resistor, wherein the transistor comprises a gate, a source, and a drain, and wherein the variable resistor is coupled between the drain and a node, comprising:
during a setting period, providing a first gate voltage to the gate, providing a first source voltage to the source, and providing a first drain voltage to the node, wherein the first source voltage is equal to a grounding voltage;
after the setting period, if a resistance value of the variable resistor is not less than a first pre-determined value, a first verification operation is performed; and
when the first verification operation is being performed, providing a second gate voltage to the gate, providing a second drain voltage to the node, and providing a second source voltage to the source, wherein the second drain voltage is less than the first drain voltage, and the second source voltage is equal to the grounding voltage.

15. The program verification method as claimed in claim 14, wherein the second gate voltage is higher than the first gate voltage.

16. The program verification method as claimed in claim 15, wherein after the performance of the first verification operation, if the resistance value of the variable resistor is not higher than a second pre-determined value, the second drain voltage is gradually increased until the resistance value of the variable resistor is higher than the second pre-determined value.

17. The program verification method as claimed in claim 16, wherein after the performance of the first verification operation, if the resistance value of the variable resistor is higher than the second pre-determined value, a second verification operation is performed,
- wherein when the second verification operation is being performed, a third gate voltage is provided to the gate, a third drain voltage is provided to the node, a third source voltage is provided to the source, and
- wherein the third gate voltage is equal to the first gate voltage, the third drain voltage is higher than the second drain voltage, and the third source voltage is equal to the grounding voltage.

18. The program verification method as claimed in claim 17, wherein after the performance of the second verification operation, if the resistance value of the variable resistor is not less than the first pre-determined value, the third drain voltage is gradually increased until the resistance value of the variable resistor is less than the first pre-determined value.

19. The program verification method as claimed in claim 16, wherein after the performance of the first verification operation, if the resistance value of the variable resistor is higher than the second pre-determined value, a second verification operation is performed,
- wherein when the second verification operation is being performed, providing a third gate voltage to the gate, a third drain voltage is provided to the node, and a third source voltage is provided to the source, and
- wherein the third gate voltage is higher than the first gate voltage, the third drain voltage is equal to the grounding voltage, and the third source voltage is higher than the second source voltage.

20. The program verification method as claimed in claim 19, wherein after the performance of the second verification operation, if the resistance value of the variable resistor is not less than the first pre-determined value, the third source voltage is gradually increased until the resistance value of the variable resistor is less than the first pre-determined value.

21. The program verification method as claimed in claim 19, wherein after the performance of the second verification operation, if the resistance value of the variable resistor is not less than a third pre-determined value, the third source voltage is gradually increased until the resistance value of the variable resistor is less than the third pre-determined value, and
- wherein the third pre-determined value is higher than the first pre-determined value.

22. The program verification method as claimed in claim 21, wherein if the resistance value of the variable resistor is less than the third pre-determined value, a third verification operation is being performed,
- wherein when the third verification operation is being performed, a fourth gate voltage is provided to the gate, a fourth drain voltage is provided to the node, and a fourth source voltage is provided to the source, and
- wherein the fourth gate voltage is equal to the first gate voltage, the fourth drain voltage is higher than the second drain voltage, and the fourth source voltage is higher than the grounding voltage.

23. The program verification method as claimed in claim 22, wherein after the performance of the third verification operation, if the resistance value of the variable resistor is not less than the first pre-determined value, the fourth source voltage is gradually increased until the resistance value of the variable resistor is less than the first pre-determined value.

24. The program verification method as claimed in claim 14, wherein the second gate voltage is equal to the first gate voltage.

25. The program verification method as claimed in claim 24, wherein after the performance of the first verification operation, if the resistance value of the variable resistor is higher than a second pre-determined value, the second drain voltage is gradually increased until the resistance value of the variable resistor is less than the second pre-determined value.

26. The program verification method as claimed in claim 25, wherein the second pre-determined value is equal to the first pre-determined value.

* * * * *